(12) United States Patent
Patel et al.

(10) Patent No.: US 6,469,908 B2
(45) Date of Patent: Oct. 22, 2002

(54) DUAL-SOCKET INTERPOSER AND METHOD OF FABRICATION THEREFOR

(75) Inventors: P. R. Patel; Yuan-Liang Li, both of Chandler; David G. Figueroa, Mesa; Shamala Chickamenahalli, Chandler; Huong T. Do, Scottsdale, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/076,893

(22) Filed: Feb. 14, 2002

(65) Prior Publication Data

US 2002/0089833 A1 Jul. 11, 2002

Related U.S. Application Data

(62) Division of application No. 09/540,046, filed on Mar. 31, 2000, now Pat. No. 6,366,467.

(51) Int. Cl.[7] .................................................. H05K 7/10
(52) U.S. Cl. ...................... 361/760; 361/803; 361/718; 361/748; 257/691; 257/718
(58) Field of Search ................................. 361/760, 736, 361/794, 803, 728, 718, 748, 792, 799; 257/691, 728; 363/35, 59, 64

(56) References Cited

U.S. PATENT DOCUMENTS

| | | | |
|---|---|---|---|
| 4,231,154 A | 11/1980 | Gazdik et al. ................. 29/840 |
| 4,860,165 A * | 8/1989 | Cassinelli ................... 165/80.4 |
| 5,627,413 A | 5/1997 | Mughir et al. ................. 307/86 |
| 5,669,783 A | 9/1997 | Inoue et al. ................. 439/331 |
| 5,712,768 A | 1/1998 | Werther ....................... 361/767 |
| 5,847,951 A | 12/1998 | Brown et al. ............... 363/147 |
| 5,864,478 A | 1/1999 | McCutchan et al. ........ 363/147 |
| 5,919,259 A * | 7/1999 | Dahl .......................... 307/130 |
| 5,973,928 A | 10/1999 | Blasi et al. ................. 361/760 |
| 6,351,392 B1 * | 2/2002 | Palaniappa ................... 257/48 |

* cited by examiner

Primary Examiner—David Martin
Assistant Examiner—Hung Bui
(74) Attorney, Agent, or Firm—Schwegman, Lundberg, Woesnner & Kluth, P.A.

(57) ABSTRACT

An interposer includes two separate sets of pins, and inserts into two sockets on a printed circuit board. One set of pins supplies power to a step down converter (SDC) mounted on the interposer. The second set of pins provide inputs and outputs to an integrated circuit mounted on the interposer. One or more conductive traces in or on the interposer electrically connect an output of the SDC to an input of the integrated circuit, thus supplying regulated power to the integrated circuit through the interposer. The SDC and integrated circuit can be directly mounted on the interposer, or either or both can be mounted on packages that connect to the interposer. The SDC and integrated circuit can be flip chips or can be connected to the interposer or package using wirebonds. The packages can be pinned or connectable by solder bumps.

7 Claims, 7 Drawing Sheets

DUAL-SOCKET INTERPOSER AND METHOD OF FABRICATION THEREFOR

This application is a divisional of application U.S. Ser. No. 09/540,046, filed on Mar. 31, 2000 now U.S. Pat. No. 6,366,467.

TECHNICAL FIELD OF THE INVENTION

The present invention relates generally to power delivery systems and fabrication methods, and more particularly to power delivery systems between a step down converter and an integrated circuit, and methods of fabricating the same.

BACKGROUND OF THE INVENTION

A requirement of most electronic systems is a regulated source of direct current (DC) voltage. Whether the DC power originates with a battery or has been converted from alternating current (AC) power, a voltage regulator circuit is usually required to provide a steady DC voltage having the correct amplitude. In some cases, however, AC power is supplied to the electronic system, in which case an AC distributor is employed to downconvert and frequency enhance the AC power.

Used in conjunction with an integrated circuit, a regulated source of power is typically provided using a step down converter (SDC), which can be, for example, a voltage regulator module (VRM) or an AC distributor. FIG. 1 illustrates a circuit 100 for supplying power to an integrated circuit load 108 in accordance with the prior art. Circuit 100 includes AC voltage source 102, SDC 104, and power delivery system 106.

Initially, voltage is supplied by AC voltage source 102. If SDC 104 is a VRM, the amplitude is then modified, and the resulting AC voltage is rectified, filtered, and regulated by SDC 104. In many cases, a separate analog-to-digital converter (not shown) is used to convert the AC power to DC before it is supplied to the VRM, whereupon the VRM steps the voltage down to a voltage required by the load 108. If SDC 104 is an AC distributor, the amplitude is modified and the frequency is enhanced before supplying the power to load 108. SDC 104 may be incorporated into a single discrete component, or may include multiple discrete components (e.g., voltage regulator, inductors, decoupling capacitors, rectifiers, etc.). The converted voltage is then supplied to load 108 through power delivery system 106. Load 108 could be, for example, one or more circuits within a microprocessor or some other type of integrated or discrete circuit.

Power delivery system 106 generally includes a series of conductive elements through which the power flows from SDC 104 to load 108. A voltage drop occurs between SDC 104 and integrated circuit load 108 due to losses along the path between SDC 104 and load 108. The voltage drop caused by power delivery system 106 can be roughly modeled by an inductor 110 in series with a resistor 112, which represent the inductance and resistance, respectively, of the conductive path between SDC 104 and load 108. In many cases, it is desirable to minimize these values in order to minimize the voltage drop that occurs through the power delivery system 106.

All other things being equal, the farther the distance between SDC 104 and integrated circuit load 108, the larger the voltage drop. At relatively low voltages, this voltage drop is a tolerable effect that is compensated for by providing an SDC that supplies a higher voltage than is actually needed by the integrated circuit. A negative side effect of this strategy, however, is that the SDC may need to be larger than necessary, and power is inefficiently consumed.

In some prior art configurations, to reduce the distance between the SDC 104 and the load 108, SDC 104 is mounted on a printed circuit (PC) board as close as practical to the integrated circuit package socket. In this configuration, current travels through traces in the PC board, and up through the socket and the package pins. The current continues along traces in the package to connections that make electrical contact with pads on the integrated circuit.

In some high performance applications, however, the electrical distance between a PC board mounted SDC and the integrated circuit is unacceptably far. One solution for reducing the electrical distance between the SDC and the integrated circuit is to mount the SDC on a power pod, and to connect the power pod to an interposer upon which the integrated circuit package is mounted.

FIG. 2 illustrates a schematic cross-section of an SDC 202 mounted on a power pod 204, and coupled to an interposer 206 via a connector 208 in accordance with the prior art. An interposer 206 essentially is a small PC board that enables other components to be mounted in close proximity to the integrated circuit, and/or that provides a dimensional interface between the connectors 210 to an integrated circuit package 212 and the pin holes of a PC board socket 214. Interposers are often used when the scale and/or location of connectors 210 are different from the scale and/or location of pin holes on the socket 214. In addition, in some cases, interposers may be used to house decoupling capacitors (not shown) or other small discrete components in close proximity to the integrated circuit package 212.

SDC 202 receives AC power and ground through pins 216 inserted into PC board 218. SDC 202 then regulates the power, as described above. The resulting voltage may then be filtered by an inductive filter and decoupling capacitors (not shown). That power is then supplied to integrated circuit 220. To supply power to the integrated circuit 220, electrical current travels from SDC 202 through traces (not shown) in power pod 204. The current then travels through connector 208 and additional traces (not shown) within interposer; 206, through connectors 210, and through still other traces (not shown) in integrated circuit package 212. Finally, the current reaches ball joints (or some other type of connector, such as bond wires), which electrically and physically connect integrated circuit 220 to package 212. Various loads (not shown) on the integrated circuit 220 may then consume the supplied power.

Unfortunately, connector 208 is a relatively high-inductance component, thus the performance of the power delivery system is reduced by its presence. In addition, connector 208 is a separate component, resulting in additional cost, reliability issues, and board, assembly procedures.

As frequencies, edge rates, and current demands of high performance integrated circuit products continue to increase, the inductance and resistance of the power delivery system become critical parameters. For the reasons stated above and for other reasons stated below, which will become apparent to those skilled in the art upon reading and understanding the present specification, there is a need in the art for a lower-inductance power delivery system than has been achieved using prior art configurations. In addition, there is a need in the art for a power delivery system that is low-cost, reliable, and does not require significant changes in board assembly procedures.

DETAILED DESCRIPTION OF THE INVENTION

The apparatus of the present invention includes an interposer having two sets of pins that connect to two sockets on a PC board. Some pins in the first set of pins are designated to supply power to a step down converter (SDC), such as a voltage regulator module (VRM) or an AC distributor. Some pins in the second set of pins are designated to provide inputs and outputs to an integrated circuit mounted on the interposer. Conductive traces in or on the interposer electrically connect the SDC output to one or more inputs to the integrated circuit. In various embodiments, the SDC and integrated circuit (or their packages) are mounted on the interposer using pin grid, ball grid, and land grid arrays. In another embodiment, the SDC is mounted on the PC board, and the first set of pins carries the SDC output to the conductive traces in or on the interposer.

Figure 1:
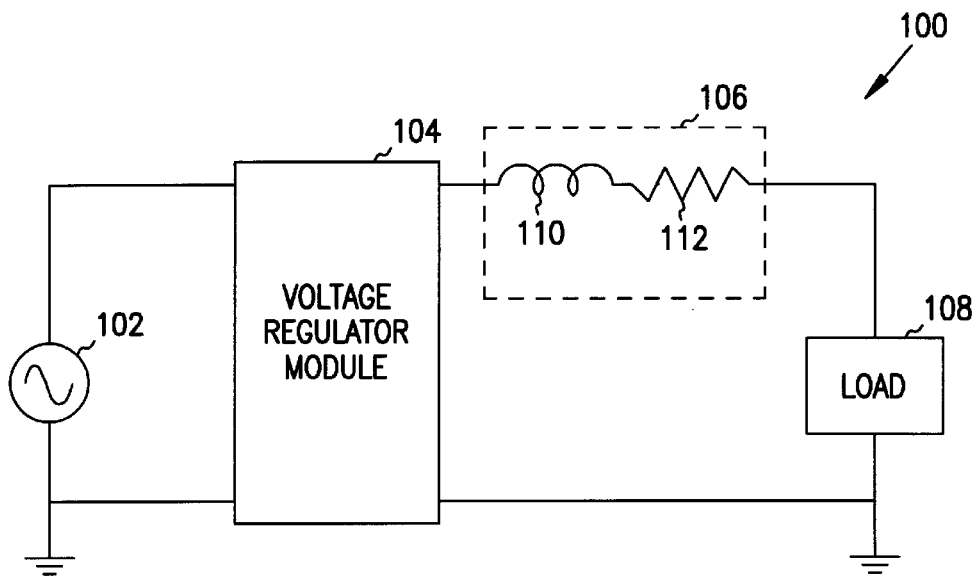
FIG. 1 illustrates a power supply circuit in accordance with the prior art.
Figure 2:
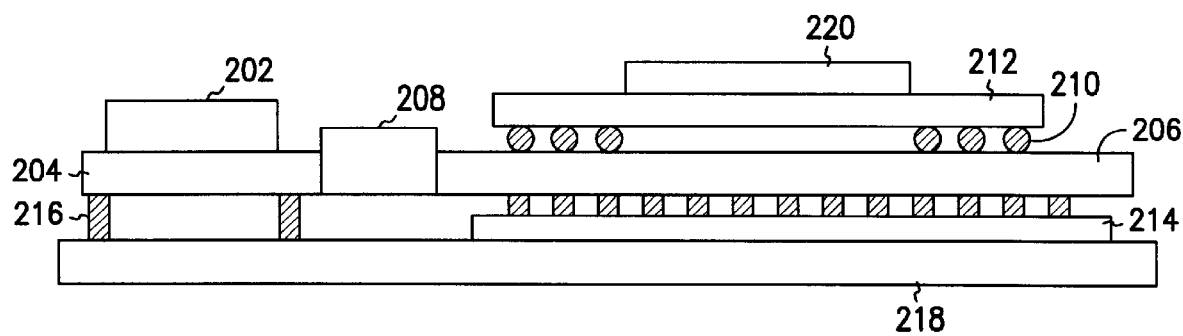
FIG. 2 illustrates a schematic cross-section of an SDC mounted on a power pod and coupled to an interposer via a connector in accordance with the prior art.
Figure 3:
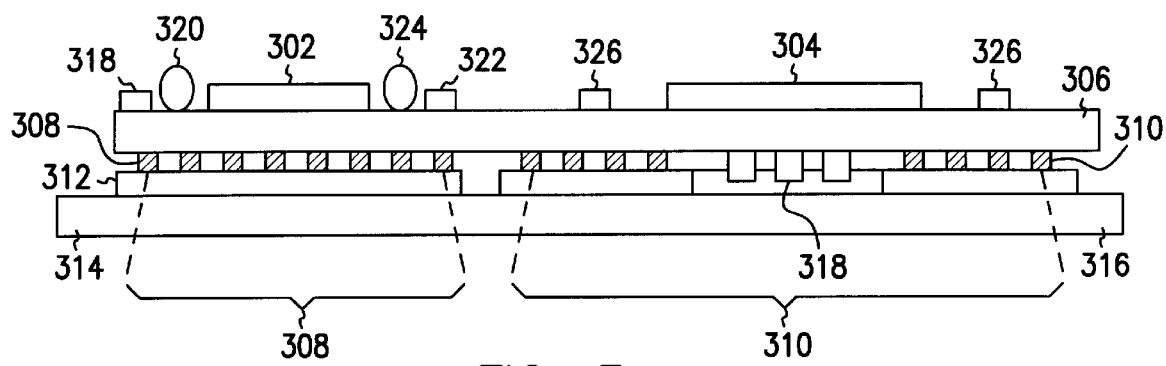
FIG. 3 illustrates a schematic cross-section of an SDC and integrated circuit mounted on a dual-socket interposer in accordance with one embodiment of the present invention.

FIG. 3 illustrates a schematic cross-section of an SDC 302 and integrated circuit package 304 mounted on a dual-socket interposer 306 in accordance with one embodiment of the present invention. Interposer 306 includes two sets of pins 308, 310 on the bottom surface of the interposer 306. The first set 308 inserts into a first socket 312 on PC board 314, while the second set 310 inserts into a second socket 316 on PC board 314.

At least some pins in the first set of pins 308 are designated to supply power to SDC 302, where that power can take the form of AC or DC current. SDC 302 can be mounted directly on interposer 306 using flip-chip technology, or in alternate embodiments, it can be mounted on a pinned, land grid, or ball grid package that connects to interposer 306. Some of these alternate embodiments are more fully described, below.

In one embodiment input capacitor 318 and input inductor 320 filter the input power, and output capacitor 322 and output inductor 324 filter the output power. The output of SDC 302 is supplied to integrated circuit 304 via conductive traces (not shown) within or on interposer 306.

At least some pins in the second set of pins 310 are designated to provide inputs and outputs to integrated circuit 304. Integrated circuit 304 can be, for example, a microprocessor or some other type of integrated circuit that requires a regulated source of power. Integrated circuit 304 can be mounted directly on interposer 306 using flip-chip technology, or in alternate embodiments, it can be mounted using flip-chip or wirebond technologies on a pinned, land grid, or ball grid package that connects to interposer 306. Some of these alternate embodiments are more fully described, below.

Various capacitors, such as die side capacitors 326 (i.e., capacitors on the top surface of interposer 306) and land side capacitors 328 (i.e., capacitors on the bottom surface of interposer 306), can be electrically connected to integrated circuit 304 in order to provide decoupling and/or excess capacitance. In one embodiment, the second set of pins 310 can be arranged so that the land side capacitors 328 do not interfere with socket 316. In other words, the array may exclude pins in its center, and the land side capacitors 328 can be mounted in the center space instead. In other embodiments, the second set of pins 310 can be a continuous array of pins, without space for land side capacitors 328. In still other embodiments, the first set of pins 308 can be arranged in a manner similar to the arrangement shown for the second set of pins 310, and some or all of the input and/or output capacitors 318, 322 and/or inductors 320, 324 can be mounted on the bottom side of interposer 306.

FIG. 3 illustrates that two separate sockets are used to supply power to SDC 302 and to provide inputs and outputs to integrated circuit 304. Unlike prior art systems, the SDC output is not supplied to integrated circuit 304 through socket 316. Instead, the SDC output is supplied to integrated circuit 304 through conductive traces (not shown) within interposer 306.

Figure 4:
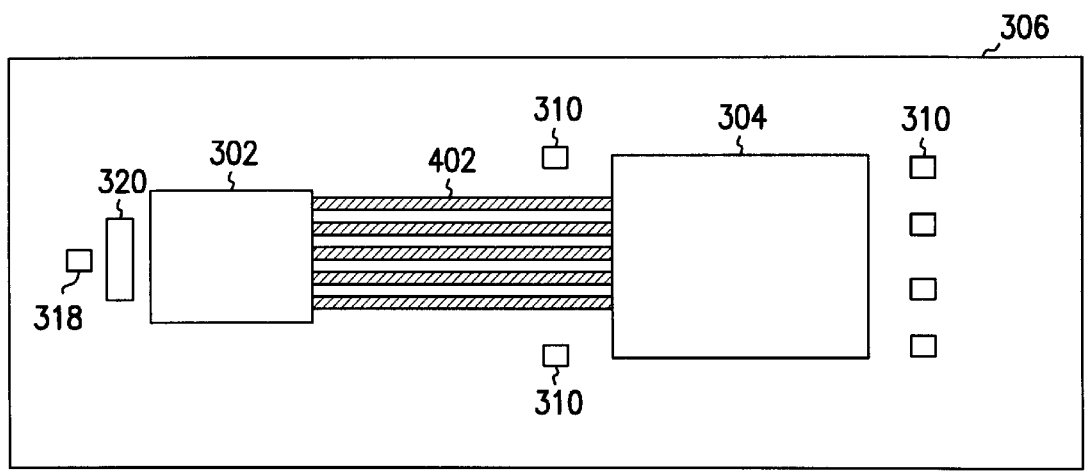
FIG. 4 illustrates a top view of the interposer configuration shown in FIG. 3 in accordance with one embodiment of the present invention.

This is depicted in more detail in FIG. 4, which illustrates a top view of the interposer configuration shown in FIG. 3 in accordance with one embodiment of the present invention. One or more conductive traces 402 electrically connect an output of SDC 302 with an input of integrated circuit 304. Conductive traces 402 may be deposited on the top or bottom surface of interposer 306, or they may be disposed in between one or more layers of interposer 306.

Referring also to FIG. 3, because the SDC output need not travel through socket 316, the SDC output has a very low inductance to the integrated circuit 304. Thus, the voltage drop between SDC 302 and integrated circuit 304 may be significantly less than can be achieved using prior art methods, making the dual-socket interposer design of the present invention better suited to high-performance applications.

Although a certain number of conductive traces 402, pins 308, 310, capacitors 318, 322, 326, 328, and inductors 320, 324 are shown in FIGS. 3 and 4, more or fewer of any of these elements could be included in any of numerous designs without departing from the scope of the present invention.

Figure 5:
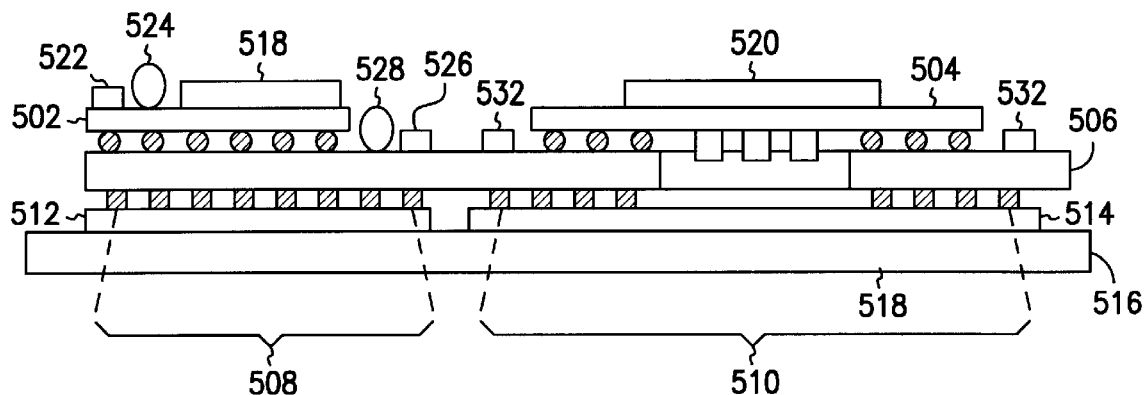
FIG. 5 illustrates a schematic cross-section of an SDC package and integrated circuit package mounted on a dual-socket interposer in accordance with another embodiment of the present invention.

FIG. 5 illustrates a schematic cross-section of an SDC package 502 and integrated circuit package 504 mounted on a dual-socket interposer 506 in accordance with another embodiment of the present invention. Conceptually, the embodiment shown in FIG. 5 is similar to that shown in FIG. 3, in that interposer 506 includes two sets of pins 508, 510 that insert into two separate sockets 512, 514 on a PC board 516. The first set of pins 508 supplies power to an SDC 518, and the second set of pins 510 provide inputs and outputs to integrated circuit 520. In addition, conductive traces (not shown) within interposer 506 electrically connect the output of SDC 518 to one or more inputs of integrated circuit 520.

In the embodiment shown in FIG. 5, however, SDC 518 is mounted on an SDC package 502, rather than being mounted directly on interposer 506. In the embodiment shown, SDC 518 is a flip-chip, and package 502 is a ball grid or land grid array package. In an alternate embodiment, SDC 518 could be wirebonded to package 502.

Input capacitor 522 and input inductor 524 are mounted on SDC package 502, while output capacitor 526 and output inductor 528 are mounted on interposer 506. In various alternate embodiments, SDC 518 could be connected to SDC package 502 using bond wires, or some other connection technology. In addition, input capacitor 522 and/or input inductor 524 could be mounted on interposer 506, and/or output capacitor 526 and/or output inductor 528 could be mounted on SDC package 502.

Also in contrast to the embodiment shown in FIG. 3, integrated circuit 520 is mounted on integrated circuit package 504, rather than being mounted directly on interposer 506. In the embodiment shown, integrated circuit 520 is a flip-chip, and package 504 is a ball grid or land grid array package. In an alternate embodiment, integrated circuit 520 could be wirebonded to package 504.

Land side capacitors 530 are mounted on the bottom surface of package 504, and interposer 506 includes an opening that accommodates capacitors 530. Decoupling capacitors 532 are mounted on interposer 506. In an alternate embodiment, decoupling capacitors 532 could be mounted on the top surface of package 504.

Figure 6:
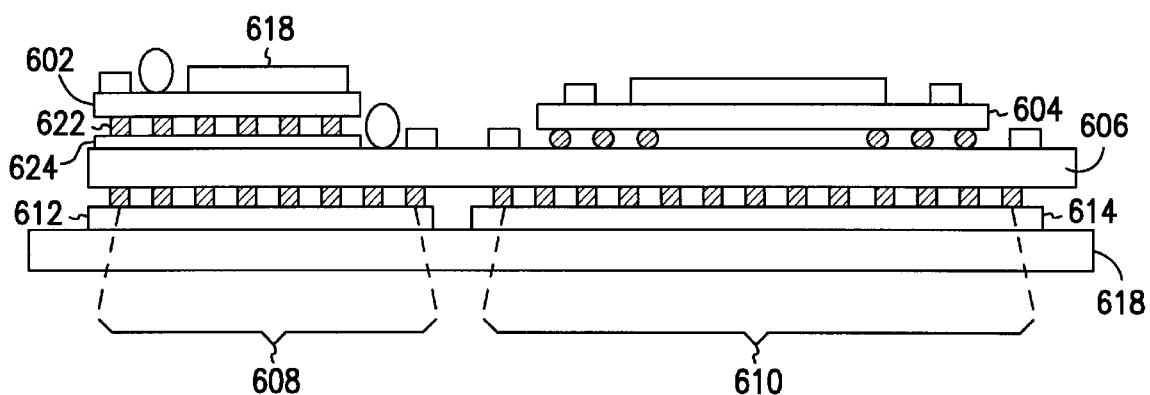
FIG. 6 illustrates a schematic cross-section of an SDC package and integrated circuit package mounted on a dual-socket interposer in accordance with another embodiment of the present invention.

FIG. 6 illustrates a schematic cross-section of an SDC package 602 and integrated circuit package 604 mounted on a dual-socket interposer 606 in accordance with another embodiment of the present invention. Conceptually, the embodiment shown in FIG. 6 is similar to that shown in FIG. 5, in that interposer 606 includes two sets of pins 608, 610 that insert into two separate sockets 612, 614 on a PC board 616. The first set of pins 608 supplies power to an SDC 618, and the second set of pins 610 provide inputs and outputs to integrated circuit 620. In addition, conductive traces (not shown) within interposer 606 electrically connect the output of SDC 618 to one or more inputs of integrated circuit 620.

In the embodiment shown in FIG. 6, however, SDC package 602 is a pinned package, where pins 622 on a bottom surface of package 602 insert into a socket 624 on the top surface of interposer 606. Some of pins 622 are dedicated to supplying input power to SDC 618, and some of pins 622 are dedicated to connecting the SDC output to the conductive traces (not shown) within interposer 606. Although the embodiment shown in FIG. 6 is a higher-inductance configuration, it enables a non-functional SDC to be easily replaced. This ability to swap out SDC packages increases board yields during production, since it eliminates the need to scrap an entire printed wiring board due to a faulty SDC.

In some cases, it may be desirable to mount the SDC on the PC board, rather than mounting it on the interposer. This may be the case, for example, when it is desirable to optimize the number of pins to meet the needed inductance, resistance, and current requirements of the integrated circuit, without requiring socket pin counts to exceed a reasonable number of pins. In addition, it may be desirable to use a commercially-available socket, rather than designing and manufacturing a specialized socket.

Figure 7:
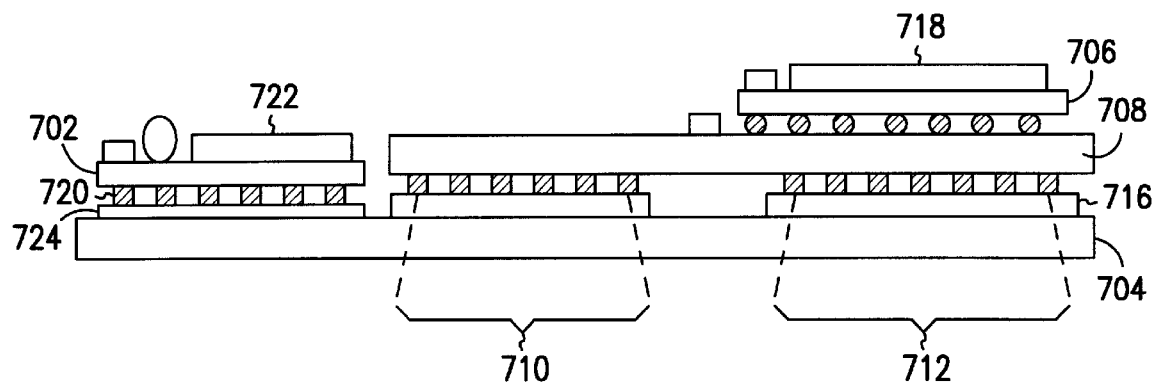
FIG. 7 illustrates a schematic cross-section of an SDC mounted on a PC board and an integrated circuit package mounted on a dual-socket interposer in accordance with another embodiment of the present invention.

Both of these performance and cost optimizations can be achieved by mounting the SDC on the PC board, and still using a dual-socket interposer to separate the SDC output pins from the integrated circuit input and output pins. FIG. 7 illustrates a schematic cross-section of an SDC package 702 mounted on a PC board 704 and an integrated circuit package 706 mounted on a dual-socket interposer 708 in accordance with another embodiment of the present invention.

Interposer 708 includes two sets of pins 710, 712 on its bottom surface. Pins 710, 712 insert into two separate sockets 714, 716 on PC board 704. The first set of pins 710 connect to conductive traces (not shown) disposed in or on interposer 708, and that electrically connect to one or more inputs of integrated circuit 718.

SDC package 702 is a pinned package, where pins 720 on a bottom surface of package 702 insert into a socket 724 on the top surface of PC board 704. In an alternate embodiment, SDC package 702 can mount to a bottom surface of PC board 704. In such an embodiment, it may be desirable from a performance perspective to mount SDC package 702 directly underneath socket 714, thus reducing the inductance between SDC package 702 and integrated circuit 718.

SDC 722 is shown as a flip-chip, although it also could be attached to package 702 using wirebond or some other packaging technology. At least some of pins 720 are dedicated to supplying input power to SDC 722, and some of pins 720 are dedicated to connecting the SDC output to conductive traces (not shown) within PC board 704. These conductive traces connect to socket 714, and thus to pins 710 and the conductive traces (not shown) within interposer 708. The conductive traces, thus, electrically connect pins 710 to one or more inputs of integrated circuit 718. In this manner, SDC output travels from SDC package 702 through pins 720, socket 724, conductive traces in PC board 704, pins 710, conductive traces (not shown) in interposer 708, and package 706 before reaching integrated circuit 718.

Figure 8:
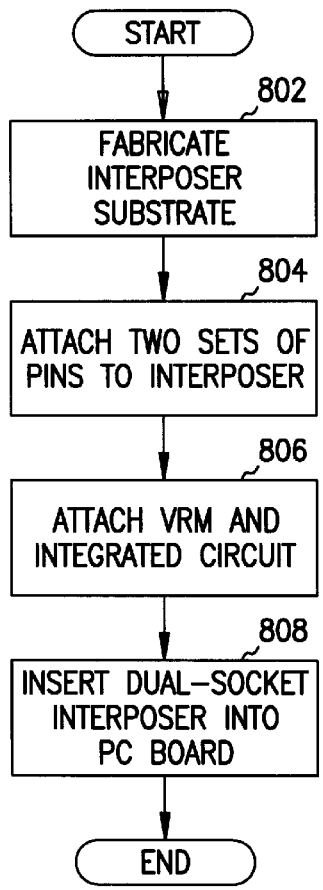
FIG. 8 illustrates a flowchart of a method for fabricating a dual-socket interposer in accordance with one embodiment of the present invention.
Figure 9:
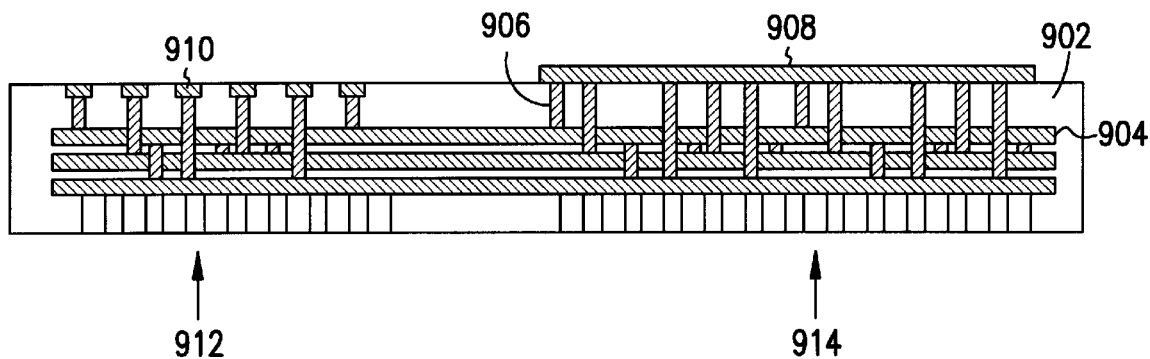
FIGS. 9–12 are schematic cross sections illustrating various stages of fabricating a dual-socket interposer in accordance with one embodiment of the present invention.
Figure 10:
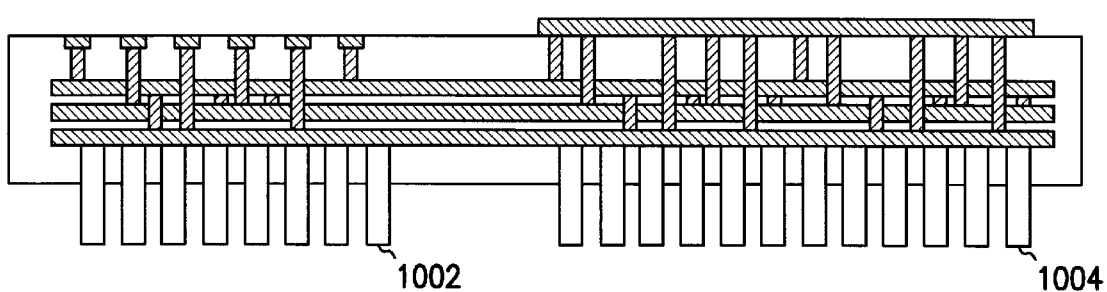
Figure 11:
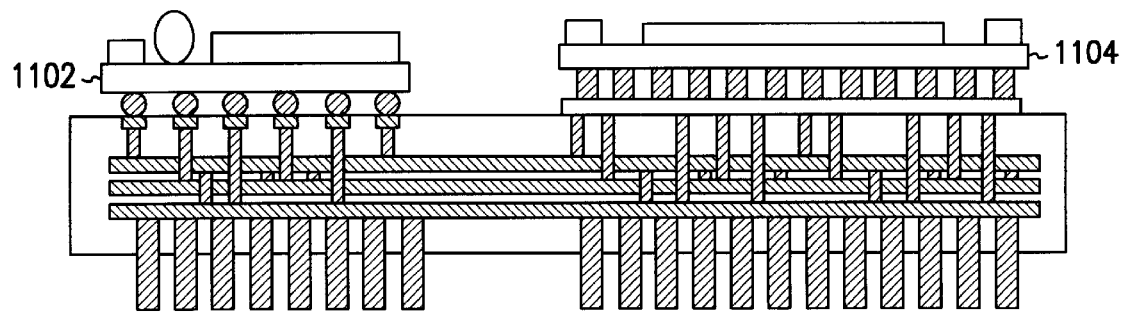
Figure 12:
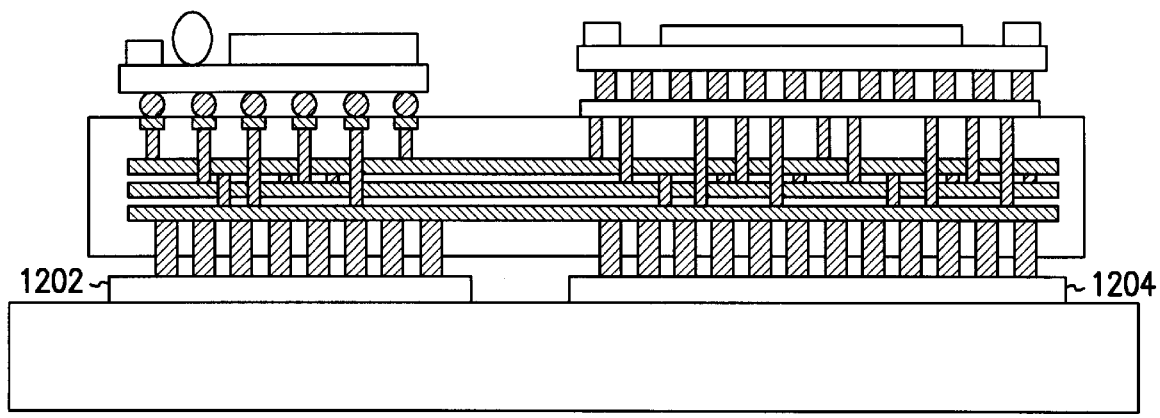

FIG. 8 illustrates a flowchart of a method for fabricating a dual-socket interposer in accordance with one embodiment of the present invention. FIG. 8 should be viewed in conjunction with FIGS. 9–12, which are schematic cross sections illustrating various stages of fabricating a dual-socket interposer in accordance with one embodiment of the present invention. The method begins, in block 802, by fabricating an interposer substrate 902 (FIG. 9). Substrate 902 includes one or more levels 904 of patterned conductive material disposed in between or on a surface of layers of non-conducting material. In addition, conductive interconnects 906 electrically connect the multiple levels 904 of conductive material, and also provide connections to one or more sockets 908 and/or pads 910 on the top surface of interposer substrate 902. Although, as will be described below, socket 908 and pads 910 are used to connect an integrated circuit package an SDC or SDC package to substrate 904, it should be understood that the use of a socket 908 and pads 910 for these respective components is for example purposes only. In various embodiments, either or both an integrated circuit (or an integrated circuit package) and an SDC (or an SDC package) could be connected to substrate 904 using a socket or pads.

Interposer substrate 902 also includes two sets 912, 914 of pin holes, located on the bottom surface of substrate 902. Pin holes 912, 914 form openings into which pins (not shown) can be inserted, making electrical contact with interconnects 906 and/or conductive material levels 904.

The process of fabricating interposer substrate 902 uses a combination of PC board fabrication techniques that are well known to those of skill in the art. Generally, these techniques involve a build-up process that begins by providing a first layer of the substrate. In one embodiment, the substrate is an organic substrate, such as an epoxy material. For example, standard PC board materials such as FR-4 epoxy-glass, polymide-glass, benzocyclobutene, Teflon, other epoxy resins, or the like could be used in various embodiments. In alternate embodiments, the substrate could consist of an inorganic substance, such as ceramic, for example. In various embodiments, the thickness of interposer substrate 902 is within a range of about 10–1000 microns. Interposer substrate 902 could consist of one or multiple layers of substrate material, where each layer is within a range of about 10–40 microns in one embodiment. Substrate 902 and its associated layers could be thicker or thinner than these ranges in other embodiments.

Generally, substrate 902 includes layers of patterned conductive material 904 separated by non-conducting dielectric layers. The patterned conductive layers 904 include conductive traces, that enable the outputs of an SDC to be electrically connected to the inputs to an integrated circuit. Thus, the patterned conductive traces interconnect some of pads 910 with some of the socket holes in socket 908.

In one embodiment, the patterned conductive layers 904 are copper layers, although other conductive metals such as tin, lead, nickel, gold, and palladium, or other materials could be used in other embodiments. In various embodiments, the thickness of each conductive layer is within a range of about 5–15 microns. The conductive layers 904 could be thicker or thinner than that range in other embodiments.

The patterned conductive layers 904 can be formed, for example, by depositing a seed layer, such as sputter-deposited or electroless-deposited copper, on a substrate layer, followed by electrolytic plating a layer of copper on the seed layer. In another embodiment, a conductive layer 904 is formed using standard photolithographic techniques. Other methods of depositing a conductive layer 904 will be apparent to those skilled in the art, such as screen printing or other printing of conductive inks. In still another embodiment, a clad laminate, such as a copper-clad laminate, could be used.

Dielectric layers are formed over some of the conductive material layers 904 in order to electrically isolate the conductive layers from each other. In one embodiment, each dielectric layer contains a metal oxide, such as tantalum oxide ($Ta_2O_5$). The metal oxide may be formed using a physical vapor deposition technique of the metal, and anodizing the layer of the metal in a weak acid electrolyte to form the metal oxide. For example, the metal may be sputter deposited from a metal target to form a layer of the metal. In one embodiment, a shadow mask can be placed on or in close proximity to the substrate to block or mask areas where deposition is not desired. Physical vapor deposition techniques also can be carried out from one or both surfaces of the substrate.

Alternatively, a metal layer may be deposited by electrolytic plating or photolithographic techniques, and converted to the metal oxide by anodization in a weak acid electrolyte. In another embodiment, dielectric layers can be formed by RF sputtering from a composite target of a dielectric material, or through reactive sputtering from multiple elemental targets, without the need for anodization or other oxidation techniques. Metal organic chemical vapor deposition (MOCVD) and sol-gel techniques have further been utilized to directly form metal oxide dielectrics. Other techniques of forming layers of dielectric material are known in the art and can include chemical vapor deposition (CVD) and plasma-enhanced CVD. Furthermore, other dielectric materials can be utilized with the various embodiments. Examples of other dielectric materials include strontium titanate ($SrTiO_3$), barium titanate ($BaTiO_3$), barium strontium titanate ($BaSrTiO_3$; BST), lead zirconium titanate ($PbZrTiO_3$; PZT), aluminum oxide ($Al_2O_3$), or zirconium oxide ($Zr_2O_3$), often formed by sputtering from a composite target or by MOCVD. Further examples include more conventional dielectric materials, such as silicon dioxide ($SiO_2$), silicon nitride (SiN), and silicon oxynitride ($SiOxNy$).

During the build-up process, portions of the conductive 904 and dielectric layers can be selectively removed, exposing portions of other conductive layers 904 underneath the removed portions. Removal of the portions of conductive material could be performed, for, example, using a common subtractive technology, such as chemical mechanical planarization to physically abrade away the material. Alternatively, a photo or laser imaging and etching process could be used. Other subtractive technologies could be used in other embodiments. In still other embodiments, additive technology could be used to deposit the desired portions of conductive layers. For example, rather than plating and subtracting portions of the conductive layers 904, portions of the conductive layers could be selectively screened or stenciled using a conductive paste.

During the build-up process, pin holes 912, 914 and holes for interconnections 906 are formed through one or more substrate layers using mechanical drilling, laser drilling, punching, or other hole formation techniques. Each interconnection 906 enables various conductive layers 904 to be electrically connected, and each could extend through all layers of substrate 902, or could be bounded above and/or below by one or more layers. If substrate 902 is an inorganic substance, such as ceramic, other hole formation techniques known to those of skill in the art would be used. For example, substrate 902 could be created with vias already existing therein.

Interconnections 906 between the various conductive layers can also be formed by selectively removing dielectric and conductive materials, exposing the conductive material on portions of the lower conductive layers 904, and then filling those holes with a conductive paste or electrolytic plating.

Some interconnections 906 couple the exposed portions of the conductive layers to the top of the interposer substrate 902. These interconnections 906 may take the form of pads 910 or lands to which socket 908 can be attached. These interconnections 906 can be formed using techniques such as filling the selectively removed portions of dielectric with conductive paste, electrolytic plating, photolithography, and/or screen printing, for example. This results in an interposer substrate 902 that includes one or more layers of patterned conductive material 904, separated by non-conducting layers, and interconnected by interconnects 906.

In alternate embodiments, different techniques can be used to interconnect and isolate the various layers of patterned conductive material 904. For example, rather than forming and selectively removing portions of the various conducting and non-conducting layers, openings between the various layers could be included by selectively adding the desired portions of the conducting and non-conducting layers. In other embodiments, removal techniques, such as chemical mechanical planarization, can be used to physically abrade away multiple layers of different types of conducting and non-conducting materials, resulting in the desired openings for various interconnects.

Although certain numbers of conductive material levels 904, interconnects 906, sockets 908, pads 910, and pin holes 912, 914 are shown in FIG. 9, the number of each of these elements could be more or fewer in various embodiments. Also, the configuration of interconnects 906 is shown for example purposes only, and different configurations could be used in different embodiments.

Referring back to FIG. 8, after the interposer substrate is fabricated, two sets of pins 1002, 1004 (FIG. 10) are attached, in block 804, to the bottom surface of interposer substrate 904. These pins 1002, 1004 are inserted into the pin holes 912, 914 (FIG. 9) created during the build-up process. Each of the first set of pins 1002 makes contact with one or more of the patterned conductive layers 904. In this manner, the first set of pins 1002 provide input power to an SDC, and the second set of pins 1004 provide inputs and outputs to an integrated circuit.

Referring back to FIG. 8, the SDC 1102 (FIG. 11) and integrated circuit 1104 are then attached, in block 806, to the interposer substrate. In one embodiment, SDC 1102 is electrically connected to some or all of contacts, for example, by depositing solder bumps on the contacts 902, and/or pads (not shown) on SDC 1102, and reflowing the solder once SDC 1102 is arranged over the corresponding contacts. Integrated circuit 1104 is mounted on a package, and the pins of the package are inserted into socket 908. In alternate embodiments, SDC 1102 may be mounted directly to the interposer substrate, integrated circuit 1104 may be on a ball grid or land grid array package and may be mounted using solder bumps, as described above, or integrated circuit 1104 may be mounted directly to the interposer substrate without the use of an integrated circuit package.

Referring back to FIG. 8, the dual-socket interposer is then inserted, in block 808, into two sockets 1202, 1204 (FIG. 12) of a PC board 1206. In this manner, the SDC 1102 and integrated circuit 1104 are electrically connected with a computer system. The method then ends.

In an alternate embodiment, such as that shown in FIG. 7, the SDC is mounted on the PC board. In such an embodiment, pads or a socket for the SDC are not included on the interposer substrate. Instead, the first set of pins is connected to the conductive traces that carry the SDC output to the integrated circuit inputs.

Figure 13:
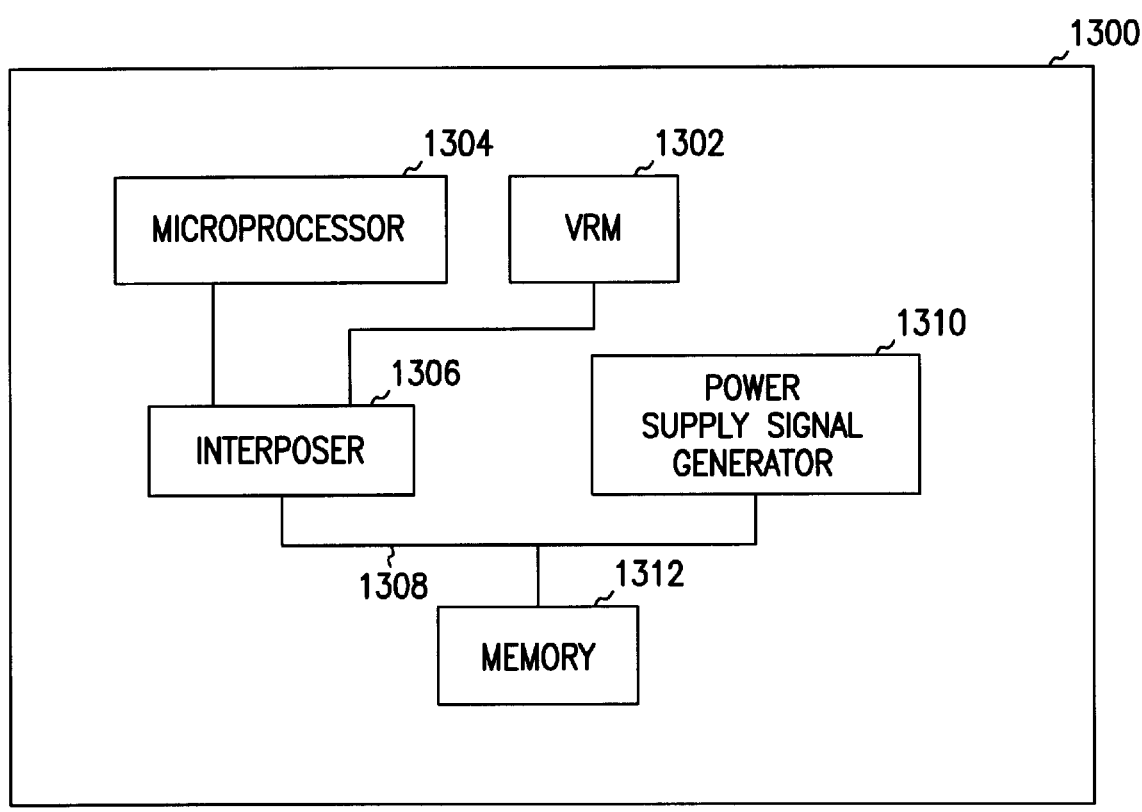
FIG. 13 illustrates a general purpose computer system in accordance with one embodiment of the present invention.

As explained previously, the interposer of the various embodiments of the present invention is connected to a PC board, which could form part of a general purpose computer system. FIG. 13 illustrates a general purpose computer system 1300 in accordance with one embodiment of the present invention.

Computer system 1300 is housed on a PC board, and includes SDC 1302, microprocessor 1304, interposer 1306, bus 1308, power supply signal generator 1310, and memory 1312. Interposer 1306 couples SDC 1302 and microprocessor 1304 to bus 1308 in order to communicate power supply signals and non-power supply signals between SDC 1302 and microprocessor 1304 and devices coupled to bus 1308. For the embodiment of the present invention shown in FIG. 13, bus 1308 couples SDC 1302 and microprocessor 1304 to memory 1312 and power supply signal generator 1310. However, it is to be understood that in alternative embodiments of the present invention, SDC 1302 and microprocessor 1304 can be coupled to memory 1312 and power supply signal generator 1310 through two different busses. In addition, in alternative embodiments of the present invention, power supply signal generator 1310 is not positioned on PC board 1302, but instead is positioned elsewhere.

Thus, various embodiments of dual-socket interposer and methods of fabricating that interposer have been described, along with a description of the incorporation of the interposer within a general purpose computer system.

The method and apparatus of the present invention provide a circuit configuration having an SDC inductively closer to the integrated circuit than is possible using prior art methods and apparatuses. In addition, use of the method and apparatus of the present invention enable designers to better optimize the number of pins to meet the needed inductance, resistance, and current requirements of the integrated circuit, without requiring socket pin counts to exceed a reasonable number of pins.

CONCLUSION

Embodiments of the present invention provide a dual-socket interposer that carries the output of an SDC to an integrated circuit mounted on the interposer along conductive traces within the interposer. In one embodiment, the SDC is mounted on the interposer, and receives input power through a first set of pins that insert into a first socket of a PC board, while the integrated circuit receives its inputs and outputs, except for the SDC inputs, through a second set of pins that insert into a second socket. In another embodiment, the SDC is mounted on the PC board, and the SDC output is brought into the interposer through a first set of pins. The first set of pins connect to conductive traces within the interposer, which connect to inputs to the integrated circuit.

In the foregoing detailed description of the preferred embodiments, reference is made to the accompanying drawings which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement which is calculated to achieve the same purpose may be substituted for the specific embodiment shown. For example, illustrative embodiments describe the SDC and integrated circuit being directly connected to an interposer using flip-chip technology or being connected to a package that connects to the interposer. The package connections are shown to be either pin grid arrays, ball grid arrays, or land grid arrays. However, those skilled in the art will recognize that many different types and combinations of interconnection technologies may be used in various embodiments of the present invention, not all of which are illustrated in the Figures. For example, any combination of flip-chip and wirebond technologies could be used to connect the SDC and integrated circuit to the interposer or to a package that connects to the interposer. In addition, any combination of pin grid array, ball grid array, land grid array or other connection technologies could be used to connect the SDC package and/or integrated circuit package to the interposer, if those packages are used in a particular embodiment. In addition, the present invention could be implemented to provide low-inductance, regulated power to other than a microprocessor. For example, the method of the present invention could be used in conjunction with a memory device, application-specific integrated circuit, or any other type of integrated or discrete circuit that requires regulated power. Therefore, all such applications are intended to fall within the spirit and scope of the present invention.

In addition, the terms "chip," "integrated circuit," "monolithic device," "semiconductor device," and "microelectronic device" are often used interchangeably in this field. The present invention is applicable to all the above as they are generally understood in the field.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. An interposer comprising:
    a first set of pins on a bottom surface of the interposer that insert into a first socket of a printed circuit board, wherein at least some of the first set of pins electrically connect an output of a step down converter (SDC) mounted on the printed circuit board to one or more conductive traces within the interposer;
    a second set of pins on the bottom surface of the interposer that insert into a second socket of the printed circuit board, wherein at least some of the second set of pins are designated to provide inputs and outputs to an integrated circuit mounted on the interposer; and
    the one or more conductive traces that electrically connect the first set of pins to a circuit within the integrated circuit.

2. The interposer as claimed in claim 1, further comprising:
    a set of pads on a top surface of the interposer that electrically connects the integrated circuit to the one or more conductive traces and to the second set of pins.

3. The interposer as claimed in claim 2, wherein the integrated circuit is mounted on an integrated circuit package, and the set of pads electrically connects the integrated circuit package to the one or more conductive traces and to the second set of pins.

4. The interposer as claimed in claim 1, wherein the integrated circuit is mounted on a pinned package, the interposer further comprising:
    a socket on a top surface of the interposer that electrically connects the pinned package to the one or more conductive traces and to the second set of pins.

5. A method for fabricating an interposer, the method comprising:
    fabricating an interposer substrate having one or more conductive traces that electrically connect a first set of pins to one or more inputs to an integrated circuit mounted on the interposer substrate;
    attaching the first set of pins in a bottom surface of the interposer substrate, wherein the first set of pins insert into a first socket of a printed circuit board, and at least some of the first set of pins are designated to carry an output of a step down converter (SDC) mounted on the printed circuit board; and
    attaching a second set of pins in the bottom surface of the interposer substrate, wherein the second set of pins insert into a second socket of the printed circuit board, and at least some of the second set of pins are designated to provide additional inputs and outputs to the integrated circuit.

6. The method as claimed in claim 5, wherein fabricating the interposer substrate comprises:
    forming a set of pads on a top surface of the interposer substrate, wherein the set of pads electrically connects the integrated circuit to the interposer substrate.

7. The method as claimed in claim 5, wherein fabricating the interposer substrate comprises:
    attaching a socket to a top surface of the interposer substrate, wherein the socket electrically connects the integrated circuit to the interposer substrate.

* * * * *

UNITED STATES PATENT AND TRADEMARK OFFICE
CERTIFICATE OF CORRECTION

PATENT NO. : 6,469,908 B2
DATED : October 22, 2002
INVENTOR(S) : Patel et al.

It is certified that error appears in the above-identified patent and that said Letters Patent is hereby corrected as shown below:

Column 2,
Line 40, delet "interposer;" and insert -- interposer --, therefor.
Line 50, delete "board," and insert -- board --, therefor.
Line 65, delete "DRAWING" and insert -- DRAWINGS --, therefor.

Column 7,
Line 51, delete "(Ta2O5)" and insert -- $(Ta_2O_5)$ --, therefor.

Column 8,
Line 9, delete "(SrTiO3)" and insert -- $(SrTiO_3)$ --, therefor.
Line 9, delete "(BaTiO3)" and insert -- $(BaTiO_3)$ --, therefor.
Line 10, delete "(BaSrTiO3; BST)" and insert --$(BaSrTiO_3; BST)$ --, therefor.
Line 11, delete "(PbZrTiO3; PZT)" and insert -- $(PbZrTiO_3; PZT)$ --, therefor.
Line 11, delete "(Al2O3)" and insert -- $(Al_2O_3)$ --, therefor.
Line 12, delete "(Zr2O3)" and insert -- $(Zr_2O_3)$ --, therefor.
Line 15, delete "(SiO2)" and insert -- $(SiO_2)$ --, therefor.
Line 16, delete "(SiOxNy)" and insert -- $(SiO_xN_y)$ --, therefor.
Line 21, delete "for, example" and insert -- for example --, therefor.

Signed and Sealed this

Twenty-seventh Day of July, 2004

JON W. DUDAS
*Acting Director of the United States Patent and Trademark Office*